(12) United States Patent
Kim et al.

(10) Patent No.: US 11,737,249 B2
(45) Date of Patent: Aug. 22, 2023

(54) MULTI-PATH COOLING SYSTEM AND COOLING SYSTEM FOR ECO-FRIENDLY VEHICLE APPLYING THE SAME

(71) Applicants: Hyundai Motor Company, Seoul (KR); Kia Motors Corporation, Seoul (KR)

(72) Inventors: Kyung Ho Kim, Gyeonggi-do (KR); Sang Wan Kim, Busan (KR); Dong Su Yang, Incheon (KR); Young Tae Yang, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 332 days.

(21) Appl. No.: 16/995,342

(22) Filed: Aug. 17, 2020

(65) Prior Publication Data
US 2021/0259141 A1  Aug. 19, 2021

(30) Foreign Application Priority Data
Feb. 13, 2020 (KR) .......... 10-2020-0017901

(51) Int. Cl.
*H05K 7/20* (2006.01)
*B60L 58/26* (2019.01)
(Continued)

(52) U.S. Cl.
CPC ..... *H05K 7/20927* (2013.01); *B01D 19/0057* (2013.01); *B60K 1/04* (2013.01);
(Continued)

(58) Field of Classification Search
CPC .......... H05K 7/20927; H05K 7/20272; B01D 19/0057; B60K 1/04; B60K 2001/0405;
(Continued)

(56) References Cited

U.S. PATENT DOCUMENTS 7,395,787 B1 * 7/2008 Claypole .................. F01P 11/04
123/41.31
10,486,526 B2 * 11/2019 Ajisaka .................. B60K 11/04
(Continued)

FOREIGN PATENT DOCUMENTS

DE  102016008834 A1 * 1/2018
JP  6507568 B2 * 5/2019
(Continued)

OTHER PUBLICATIONS

Nishio Yoshiaki, "On-Vehicle Equipment Cooling Structure", May 8, 2019, Mitsubishi Motors Corp, Entire Document (Translation of JP 6507568). (Year: 2019).*
(Continued)

*Primary Examiner* — Stephen S Sul
(74) *Attorney, Agent, or Firm* — Fox Rothschild LLP

(57) ABSTRACT

A multi-path cooling system is provided that includes a first cooling path in which a refrigerant is circulated by a first pump and a second cooling path in which the refrigerant is circulated by a second pump. A reservoir tank is provided through which the refrigerant circulating through the first cooling path enters or exits. An air separator is disposed on the second cooling path to separate air from the passing refrigerant when the refrigerant circulating through the second cooling path passes. The reservoir tank and the air separator communicate with each other.

9 Claims, 3 Drawing Sheets

(51) Int. Cl.
  *B60L 53/22* (2019.01)
  *B60K 1/04* (2019.01)
  *B62D 25/08* (2006.01)
  *B01D 19/00* (2006.01)

(52) U.S. Cl.
  CPC .............. *B60L 53/22* (2019.02); *B60L 58/26* (2019.02); *B62D 25/082* (2013.01); *H05K 7/20272* (2013.01); *B60K 2001/0405* (2013.01)

(58) Field of Classification Search
  CPC ............... B60K 1/00; B60K 2001/003; B60K 2001/005; B60K 2001/006; B60K 11/02; B60K 11/04; B60K 2001/0433; B60L 53/22; B60L 58/26; B62D 25/082; Y02E 60/10; Y02T 10/70; Y02T 10/7072; Y02T 90/14; Y02T 90/16; F01P 7/165; F01P 11/028; F01P 11/029; F01P 2005/105; F01P 2050/22; F01P 2050/24; H01M 10/613; H01M 10/625; H01M 10/6568
  See application file for complete search history.

(56) References Cited

U.S. PATENT DOCUMENTS

| | | | |
|---|---|---|---|
| 2014/0305153 A1* | 10/2014 | Arai | H01L 23/473 62/190 |
| 2018/0086224 A1* | 3/2018 | King | B60H 1/32281 |
| 2019/0039434 A1* | 2/2019 | Wallace | B60K 11/02 |
| 2019/0152287 A1* | 5/2019 | Ajisaka | B60H 1/00885 |
| 2020/0109657 A1* | 4/2020 | Park | B60S 1/563 |
| 2020/0166116 A1* | 5/2020 | Jang | B60K 7/0007 |
| 2020/0189417 A1* | 6/2020 | Amarasinghe | H01M 10/613 |

FOREIGN PATENT DOCUMENTS

| | | |
|---|---|---|
| KR | 10-2014-0048359 A | 4/2014 |
| KR | 10-2016-0003148 A | 1/2016 |

OTHER PUBLICATIONS

Wissdorf Peter, "Kraftfahrzeugkuhlung und Verfahren zum Kühlen eines Abgasturboladers im Stillstand des Kraftfahrzeugs", Jan. 25, 2018, GM Global Tech Operations LLC, Entire Document (Translation of: DE 102016008834). (Year: 2018).*

* cited by examiner

MULTI-PATH COOLING SYSTEM AND COOLING SYSTEM FOR ECO-FRIENDLY VEHICLE APPLYING THE SAME

CROSS REFERENCE TO RELATED APPLICATION

The present application claims priority to Korean Patent Application No. 10-2020-0017901, filed Feb. 13, 2020, the entire contents of which are incorporated herein for all purposes by this reference.

BACKGROUND

Field of the Disclosure

The present disclosure relates to a multi-path cooling system having a plurality of cooling paths for supplying a refrigerant to a cooling target, and a cooling system for an eco-friendly vehicle applying the multi-path cooling system.

Description of the Related Art

Generally, an eco-friendly vehicle (or environment-friendly vehicle) that produces vehicle power by driving a motor using electric energy may include a high-power motor that provides a driving force to a wheel, a high-voltage battery that stores electric energy supplied to the motor, various power conversion components that convert direct current (DC) power stored in the high-voltage battery into three-phase alternating current (AC) power for driving the motor, and a charger that is supplied with power from an external device to charge the high-voltage battery.

In the eco-friendly vehicle, when the high-voltage battery is charged with the electric energy through the charger or the power of the high-voltage battery is converted, a substantial amount of heat is generated from the charger, the battery, several power conversion components, the motor or the like. Meanwhile, if excessive heat is generated, the risk of accidents may increase due to the malfunction of components, and durability may decrease due to a reduction in performance or deterioration of a component itself, and thus, a cooling system capable of effectively discharging heat generated from the components is required.

Since an air cooling method using the air in the cooling system applies a duct structure for cooling a module to an interior of a battery module, the volume of the high-voltage battery increases, may be disadvantageous in terms of vehicle interior marketability (e.g., storage space and occupying space), and may limit the capacity of the high-voltage battery.

A water cooling method using a liquid refrigerant such as a coolant in the cooling system mainly employs a complex cooling method (e.g., integrated cooling method) of cooling the high-voltage battery and several electronic components using one or more coolant flow paths. Such a complex cooling method is problematic in that a path for cooling becomes complex and expensive components such as a 3-way valve are required for a coolant pipe to generate various paths in which a refrigerant may flow, thus leading to an increase in cost.

Particularly, the environment-friendly vehicle requires high capacity and high voltage. Thus, as the number of electronic components that are to be cooled increases, positions where the electronic components are mounted are very limited. Particularly, in the case of an on-board charger, there is a difficulty in determining a proper position for receiving power supplied through a charging port while being included in a cooling path.

The description provided above as a related art of the present disclosure is merely for helping understanding the background of the present disclosure and should not be construed as being included in the related art known by those skilled in the art.

SUMMARY

The present disclosure provides a multi-path cooling system having a plurality of cooling paths and a cooling system for an eco-friendly vehicle applying the multi-path cooling system, in which a plurality of paths where a refrigerant flows is provided and the cooling paths may be integrated with each other, thus reducing the number of components for forming the cooling paths and thereby reducing the complexity of the cooling paths, and consequently improving the degree of installation freedom of several electronic components that are to be cooled.

According to one aspect of the present disclosure, the disclosure provides a multi-path cooling system including a first cooling path in which a refrigerant may be circulated by a first pump; a second cooling path in which the refrigerant may be circulated by a second pump; a reservoir tank where the refrigerant circulating through the first cooling path enters or is discharged; and an air separator disposed on the second cooling path to separate air from the passing refrigerant when the refrigerant circulating through the second cooling path passes. The reservoir tank and the air separator may communicate with each other.

The air separator may include on an upper end thereof an air outlet to discharge the separated air, and the air outlet and a lower portion of the reservoir tank storing the refrigerant therein may communicate with each other. The air separator may be disposed under a lower end of the reservoir tank.

Furthermore, to achieve the objective of the present disclosure, the disclosure provides a cooling system for an eco-friendly vehicle applying a multi-path cooling system that may include a first cooling path in which a refrigerant may be circulated by a first pump; an electronic component for power disposed on the first cooling path and cooled by the refrigerant circulated by the first pump; a second cooling path in which the refrigerant may be circulated by a second pump; a battery disposed on the second cooling path, cooled by the refrigerant circulated by the second pump, and configured to store energy supplied to the electronic component for power; a reservoir tank where the refrigerant circulating through the first cooling path enters or exits; and an air separator provided on the second cooling path to separate air from the passing refrigerant when the refrigerant circulating through the second cooling path passes. The reservoir tank and the air separator may communicate with each other.

The air separator may include on an upper end thereof an air outlet to discharge the separated air, and the air outlet and a lower portion of the reservoir tank storing the refrigerant therein may communicate with each other. The air separator may be disposed under a lower end of the reservoir tank. The cooling system may further include a radiator disposed on the first cooling path to cool the refrigerant circulated by the first pump. The cooling system may include a chiller disposed on the second cooling path to cool the refrigerant circulated by the second pump. Additionally, the cooling system may include an on-board charger disposed on the second cooling path, cooled by the refrigerant circulated by the second pump, and configured to convert power supplied from an external device, thus generating power for charging the battery.

The electronic component for power, the reservoir tank, and the air separator may be installed in an engine room of the vehicle, and the battery may be installed outside a lower portion of the vehicle. Further, the electronic component for power, the reservoir tank, and the air separator may be installed in an engine room of the vehicle, the battery may be installed outside a lower portion of the vehicle, and the on-board charger may be installed behind a second row seat of the vehicle.

According to the multi-path cooling system and the cooling system for the eco-friendly vehicle applying the multi-path cooling system, the reservoir tank installed on one cooling path and the air separator installed on the other cooling path communicate with each other, and thus, the two cooling paths may be managed separately, and thereby an expensive component such as a 3-way valve and the reservoir tank on one cooling path may be omitted, and consequently the complexity of the cooling system may be reduced, the cost for realizing the cooling system may be reduced, and the space for installing the cooling system in the engine room of the eco-friendly vehicle may be secured.

Furthermore, according to the multi-path cooling system and the cooling system for the eco-friendly vehicle applying the multi-path cooling system, the battery may be installed outside the vehicle under the center floor of the vehicle and the on-board charger may be installed behind the second row seat, and thus, it may be possible to install the charger having a sufficient capacity and size and thereby to decrease a charging period. The battery and the on-board charger may be cooled by one cooling path, and thus, it may be possible to save energy required for cooling the electronic component that does not require cooling during charging. Moreover, since the on-board charger may be disposed behind the second row seat, it may be easier to standardize the position of the charging port of the vehicle connected to external charging equipment so that this position corresponds to the position of a fuel inlet of a general internal combustion engine vehicle.

Effects of the present disclosure are not limited to the above-mentioned effects, and those skilled in the art will clearly understand other effects from the following description.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, a multi-path cooling system and a cooling system for an eco-friendly vehicle applying the multi-path cooling system according to an exemplary embodiment of the present disclosure will be described in detail with reference to the accompanying drawings.

Figure 1:
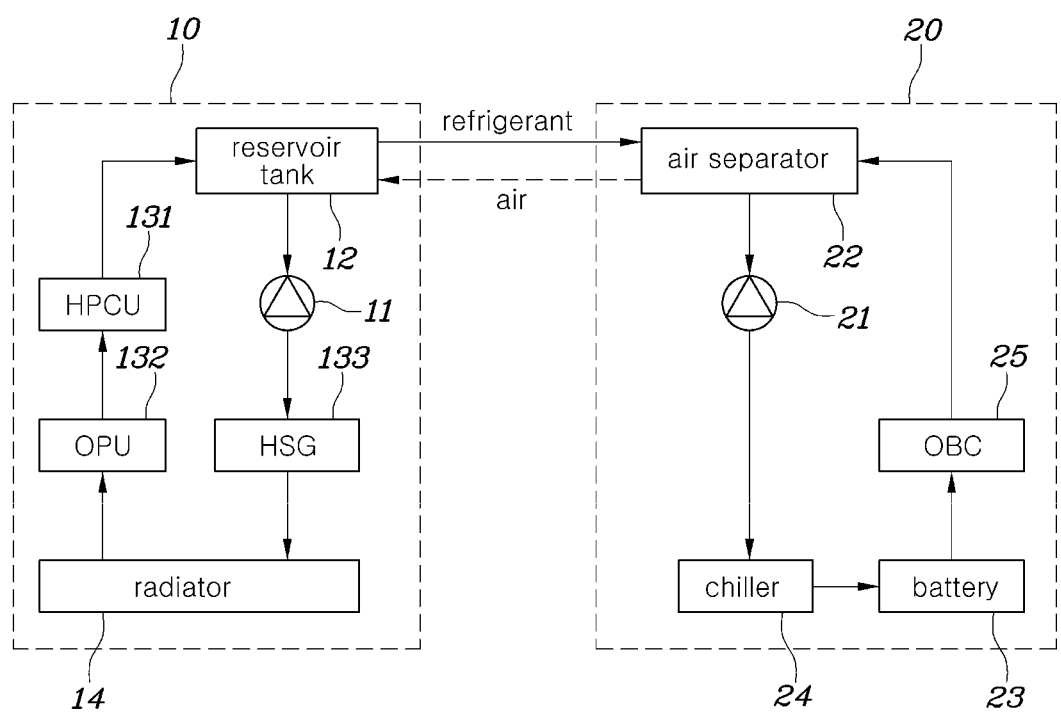
FIG. 1 is a diagram showing a multi-path cooling system according to an exemplary embodiment of the present disclosure.

FIG. 1 is a diagram showing a multi-path cooling system according to an embodiment of the present disclosure. Referring to FIG. 1, the multi-path cooling system according to the exemplary embodiment of the present disclosure may include a first cooling path 10 in which a refrigerant is circulated by a first pump 11, a second cooling path 20 in which the refrigerant is circulated by a second pump 21, a reservoir tank 12 where the refrigerant circulating through the first cooling path 10 may enter or be discharged, and an air separator 22 which separates air from the refrigerant when the refrigerant circulating through the second cooling path passes.

The first cooling path 10 may include a coolant pipe (see an arrow of FIG. 1) through which a liquid refrigerant may flow, and the first pump 11 may be configured to circulate the liquid refrigerant. The first pump 11 may be configured to eject the liquid refrigerant into the first cooling path 10 at high pressure to circulate the refrigerant. The first cooling path 10 may include the reservoir tank 12 that appropriately adjusts the amount of the refrigerant circulating in the first cooling path 10 while the refrigerant circulating in the first cooling path 10 enters or exits, and simultaneously removes the air contained in the refrigerant circulating in the first cooling path 10.

The reservoir tank 12 may include an input port into which circulating liquid may be input, an output port through which the liquid may be output or discharged to a circulation path, and a cap which discharges air collected from the stored liquid to an outside when pressure reaches a predetermined level. Since the structure of the reservoir tank 12 is known to those skilled in the art, a detailed description thereof will be omitted herein. In addition, components 131, 132, and 133 that are to be cooled may be disposed on the first cooling path 10 to be reduced in temperature through heat exchange with the liquid refrigerant flowing through the first cooling path 10. A radiator 14, which is the device configured to reduce the temperature of the liquid refrigerant through heat exchange with the liquid refrigerant flowing through the first cooling path 10, may be disposed on the first cooling path 10.

The second cooling path 20 may include the coolant pipe (see the arrow of FIG. 1) through which the liquid refrigerant flows, and the second pump 21 configured to circulate the liquid refrigerant. The second pump 21 may be configured to discharge or eject the liquid refrigerant into the second cooling path 20 at high pressure to circulate the refrigerant. In addition, components 23 and 25 that are to be cooled may be disposed on the second cooling path 20 to be reduced in temperature through heat exchange with the liquid refrigerant flowing through the second cooling path 20. A chiller 24 configured to reduce the temperature of the liquid refrigerant through heat exchange with the liquid refrigerant flowing through the second cooling path 20, may be disposed on the second cooling path 20.

Particularly, in an exemplary embodiment of the present disclosure, the second cooling path 20 has no reservoir tank that appropriately adjusts the amount of the liquid refrigerant circulating in the second cooling path 20 as in the first cooling path 10. Instead, the second cooling path 20 may include the air separator 22 configured to separate air from the refrigerant while the refrigerant circulating through the second cooling path 20 passes.

Generally, the air separator 22 may be configured to separate the air from fluid (in the present disclosure, liquid refrigerant flowing through the second cooling path 20) inside a closed system using a reduction in flow rate and a centrifugal force. The liquid refrigerant introduced into the air separator 22 may be rotated in the air separator 22 by a structure formed inside the air separator 22. Thus, according to Henry's law where solubility is in inverse proportion to pressure, pressure in a central portion of the rotating refrigerant is reduced, and thus, air dissolved in the refrigerant may be separated. The separated air may flow above the refrigerant due to a difference in specific gravity between the air and the refrigerant, and the refrigerant passing through the air separator 22 may flow through the second cooling path 20 again. The air separated by the air separator 22 may be discharged through an air outlet that is provided on an upper portion of the air separator 22.

Figure 2:
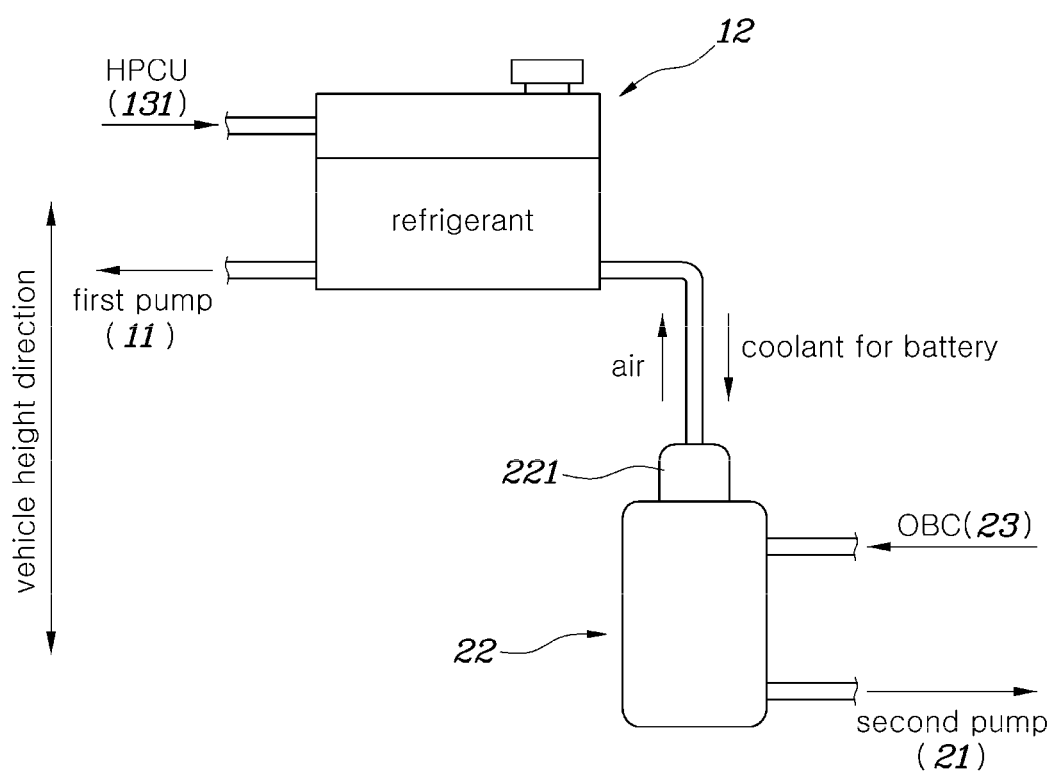
FIG. 2 is a diagram showing an example of a connecting relationship between a reservoir tank and an air separator shown in FIG. 1 according to an exemplary embodiment of the present disclosure.

FIG. 2 is a diagram showing an example of a connecting relationship between the reservoir tank and the air separator shown in FIG. 1 Referring to FIG. 2, in an exemplary embodiment of the present disclosure, the air outlet 221 disposed on the upper portion of the air separator 22 may be configured to continuously communicate with a lower portion of the reservoir tank 12 disposed on the first cooling path 10, that is, an area in which the refrigerant is stored. Thus, the air separated by the air separator 22 may flow through the reservoir tank 12 and then may be discharged through an air discharge structure disposed on the cap of the reservoir tank 12 to the outside. If necessary, the refrigerant of the reservoir tank 12 provided disposed the first cooling path 10 may be refilled into the second cooling path 20.

When considering that the air in the liquid is moved above the liquid by the specific gravity difference and the liquid always flows in the direction of the gravity, i.e. the ground, as shown in FIG. 2, the air separator 22 may be disposed under a lower end of the reservoir tank 12 in a direction perpendicular to the ground.

Figure 3:
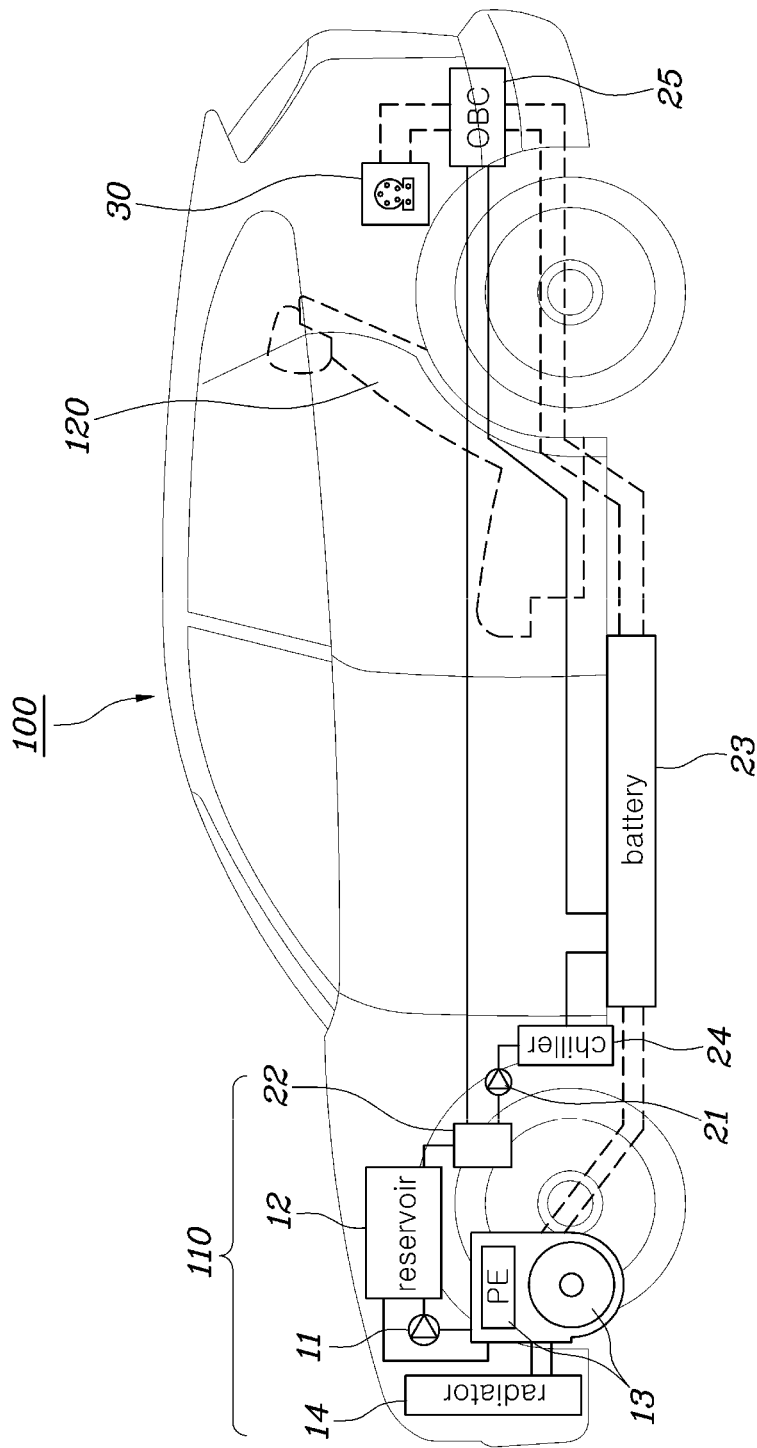
FIG. 3 is a diagram showing an installation example of a cooling system for an eco-friendly vehicle applying the multi-path cooling system of FIG. 1 according to an exemplary embodiment of the present disclosure.

FIG. 3 is a diagram showing an installation example of a cooling system for an eco-friendly vehicle applying the multi-path cooling system of FIG. 1. An exemplary embodiment of the present disclosure provides the cooling system for the eco-friendly vehicle applying the above-described multi-path cooling system.

Referring to FIGS. 1 and 3, the cooling system for the eco-friendly vehicle according to an exemplary embodiment of the present disclosure may include a first cooling path 10 in which a refrigerant may be circulated by a first pump 11, electronic components 131, 132, and 133 for power which may be disposed on the first cooling path 10 and may be cooled by the refrigerant circulated by the first pump 11, a second cooling path 20 in which the refrigerant may be circulated by a second pump 21, a battery 23 disposed on the second cooling path 20, cooled by the refrigerant circulated by the second pump 21, and configured to store energy supplied to the electronic components 131, 132, and 133 for power, a reservoir tank 12 into which the refrigerant circulating through the first cooling path 10 may enter or be discharge from, and an air separator 22 installed on the second cooling path 20 and configured to separate air from the passing refrigerant when the refrigerant circulating through the second cooling path 20 passes.

In an exemplary embodiment of the present disclosure, the reservoir tank 12 and the air separator 22 may communicate with each other, and thus, the air separated from the air separator 22 may flow into the reservoir tank 12 and the refrigerant stored in the reservoir tank 12 may move through the air separator 22 to the second cooling path 20, as described above. In the cooling system for the eco-friendly vehicle according to the exemplary embodiment of the present disclosure, the first cooling path 10 may include, as a cooling target, the electronic component 13 such as a hybrid power control unit (HPCU) 131 having an inverter configured to convert power stored in the battery 23 to drive a motor or the like, an oil pump unit (OPU) 132 supplied with power stored in the battery 23 in a converted form to be operated, or a hybrid starter generator 133.

Furthermore, as described above, the first cooling path 10 may include a radiator 14 configured to cool the refrigerant flowing through the first cooling path 10. A motor configured to drive the environment-friendly vehicle, an oil pump related to the driving of the engine or the like, and a power conversion device configured to convert power to supply the power the above-described components may be mounted within an engine room 110 of a vehicle 100 and thus, the components may be supplied with the refrigerant cooled by the radiator 14 and then may be cooled.

Particularly, since an exemplary embodiment of the present disclosure may omit the reservoir required for the second cooling path 20, space of the engine room 110 in which components required for cooling may be installed may be secured more easily. The second cooling path 20 may include the battery 23 and an on-board charger (OBC) 25 configured to supply charging power to the battery 23, as a cooling target. Among the eco-friendly vehicle, an electric vehicle or a plug-in hybrid vehicle requires a higher capacity battery 23 than that of a general hybrid vehicle, and also requires an on-board charger 25 for charging the battery 23. Since the high capacity battery is too large to be installed in the engine room of the vehicle or a trunk of the vehicle, the battery 23 may be installed in an underbody of the vehicle, namely, outside a vehicle chassis under a center floor.

Particularly, the on-board charger 25 may be installed in a trunk area of the vehicle, namely, behind a second row seat 120 of the vehicle. In particular, since a charging port 30 for charging the battery of the eco-friendly vehicle may be installed in an area corresponding to a fuel inlet of a normal internal combustion engine vehicle, it is suitable for standardizing the position of the charging port of the eco-friendly vehicle. Furthermore, since it may be possible to secure a sufficient installation space behind the second row seat 120, the on-board charger 25 may be sufficiently accommodated even if the size of the on-board charger increases due to an increase in its capacity. In other words, restrictions on the increase in the capacity of the on-board charger 25 may be removed, which may lead to a reduction in charging time through an increase in sufficient capacity.

Since the battery 23 and the on-board charger 25 are installed on the second cooling path 20, only the battery 23 and the on-board charger 25, which generate heat when the battery 23 is charged by driving only the second pump 21, may be selectively cooled. In other words, since it is unnecessary to supply the refrigerant to the electronic component 13 that is cooled by the first cooling path 10, the refrigerant may be selectively supplied to only a target that is to be cooled during charging without energy loss, and thereby it may be possible to reduce the energy loss caused by the driving of the cooling system.

Although the present disclosure was described with reference to specific exemplary embodiments shown in the drawings, it is apparent to those skilled in the art that the present disclosure may be changed and modified in various ways without departing from the scope of the present disclosure, which is described in the following claims.

What is claimed is:

1. A multi-path cooling system, comprising:
    a first cooling path in which a refrigerant is circulated by a first pump;
    a second cooling path in which the refrigerant is circulated by a second pump;
    a reservoir tank through which the refrigerant circulating through the first cooling path enters or exits; and
    an air separator disposed on the second cooling path to separate air from the refrigerant when the refrigerant circulating through the second cooling path passes,
    wherein the reservoir tank and the air separator directly communicate with each other, and
    wherein the air separator includes on an upper end thereof an air outlet to discharge the separated air, and the air outlet and a lower portion of the reservoir tank storing the refrigerant therein communicate with each other.

2. The multi-path cooling system of claim 1, wherein the air separator is disposed under a lower end of the reservoir tank.

3. A cooling system for an eco-friendly vehicle applying a multi-path cooling system, comprising:
    a first cooling path in which a refrigerant is circulated by a first pump;
    an electronic component for power disposed on the first cooling path and cooled by the refrigerant circulated by the first pump;
    a second cooling path in which the refrigerant is circulated by a second pump;
    a battery disposed on the second cooling path, cooled by the refrigerant circulated by the second pump, and configured to store energy supplied to the electronic component for power;
    a reservoir tank through which the refrigerant circulating through the first cooling path enters or exits; and
    an air separator disposed on the second cooling path to separate air from the refrigerant when the refrigerant circulating through the second cooling path passes,
    wherein the reservoir tank and the air separator directly communicate with each other, and
    wherein the air separator includes on an upper end thereof an air outlet to discharge the separated air, and the air outlet and a lower portion of the reservoir tank storing the refrigerant therein communicate with each other.

4. The cooling system of claim 3, wherein the air separator is disposed under a lower end of the reservoir tank.

5. The cooling system of claim 3, further comprising:
a radiator disposed on the first cooling path to cool the refrigerant circulated by the first pump.

6. The cooling system of claim 3, further comprising:
a chiller disposed on the second cooling path to cool the refrigerant circulated by the second pump.

7. The cooling system of claim 3, further comprising:
an on-board charger disposed on the second cooling path, cooled by the refrigerant circulated by the second pump, and configured to convert power supplied from an external device to generate power for charging the battery.

8. The cooling system of claim 7, wherein the electronic component for power, the reservoir tank, and the air separator are installed within an engine room of the eco-friendly vehicle, the battery is installed outside a lower portion of the eco-friendly vehicle, and the on-board charger is installed behind a second row seat of the eco-friendly vehicle.

9. The cooling system of claim 3, wherein the electronic component for power, the reservoir tank, and the air separator are installed within an engine room of the eco-friendly vehicle, and the battery is installed outside a lower portion of the eco-friendly vehicle.

* * * * *